United States Patent
Basceri et al.

(10) Patent No.: US 6,673,669 B2
(45) Date of Patent: Jan. 6, 2004

(54) METHOD OF REDUCING OXYGEN VACANCIES AND DRAM PROCESSING METHOD

(75) Inventors: Cem Basceri, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/358,727

(22) Filed: Feb. 4, 2003

(65) Prior Publication Data

US 2003/0143801 A1 Jul. 31, 2003

Related U.S. Application Data

(62) Division of application No. 10/055,512, filed on Oct. 25, 2001, now Pat. No. 6,579,756, which is a division of application No. 09/388,827, filed on Sep. 1, 1999, now Pat. No. 6,337,237.

(51) Int. Cl.$^7$ .......................................... H01L 21/8242
(52) U.S. Cl. ...................................................... 438/240
(58) Field of Search ................................ 438/240, 771, 438/402, 404, 236; 257/310; 322/10

(56) References Cited

U.S. PATENT DOCUMENTS 5,889,647 A    3/1999  Hansen et al.
6,281,142 B1 * 8/2001  Basceri et al. .............. 438/771

OTHER PUBLICATIONS

U.S. patent application Ser. No. 09/326,429, Basceri et al., filed Jun. 4, 1999.

* cited by examiner

Primary Examiner—Craig A. Thompson
(74) Attorney, Agent, or Firm—Wells St. John P.S.

(57) ABSTRACT

A capacitor processing method includes forming a capacitor comprising first and second electrodes having a capacitor dielectric region therebetween. The first electrode interfaces with the capacitor dielectric region at a first interface. The second electrode interfaces with the capacitor dielectric region at a second interface. The capacitor dielectric region has a plurality of oxygen vacancies therein. After forming the capacitor, an electric field is applied to the capacitor dielectric region to cause oxygen vacancies to migrate towards one of the first and second interfaces. Oxygen atoms are preferably provided at the one interface effective to fill at least a portion of the oxygen vacancies in the capacitor dielectric region. Preferably at least a portion of the oxygen vacancies in the high k capacitor dielectric region are filled from oxide material comprising the first or second electrode most proximate the one interface. In one implementation, a DRAM processing method includes forming DRAM circuitry comprising DRAM array capacitors having a common cell electrode, respective storage node electrodes, and a high k capacitor dielectric region therebetween. A voltage is applied to at least one of the first and second electrodes to produce a voltage differential therebetween under conditions effective to cause oxygen vacancies in the high k capacitor dielectric region to migrate toward one of the cell electrode or the respective storage node electrodes and react with oxygen to fill at least a portion of the oxygen vacancies in the capacitor dielectric region.

28 Claims, 2 Drawing Sheets

METHOD OF REDUCING OXYGEN VACANCIES AND DRAM PROCESSING METHOD

RELATED PATENT DATA

This patent resulted from a divisional application of U.S. patent application Ser. No. 10/055,512 filed on Oct. 25, 2001, naming Gem Basceri and Gurtej S. Sandhu as inventors, now U.S. Pat. No. 6,579,756 the disclosure of which is incorporated by reference, and which is a divisional application of U.S. patent application Ser. No. 09/388,827 filed on Sep. 1, 1999. Now U.S. Pat. No. 6,337,237.

TECHNICAL FIELD

This invention relates to capacitor processing methods, for example as found in logic and memory circuitry, and even more specifically to DRAM processing methods.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs and beyond will be on the order of 0.25 micron or less, and conventional dielectrics such as $SiO_2$ and $Si_3N_4$ might not be suitable because of small dielectric constants.

Highly integrated memory devices, such as 256 Mbit DRAMs and beyond, are expected to require a very thin dielectric film for the 3-dimensional capacitor of cylindrically stacked or trench structures. To meet this requirement, the capacitor dielectric film thickness will be below 2.5 nm of $SiO_2$ equivalent thickness.

Insulating inorganic metal oxide materials have high dielectric constants and low leakage current which make them attractive as cell dielectric materials for high density DRAMs and non-volatile memories. Such materials include tantalum pentoxide, barium strontium titanate, strontium titanate, barium titanate, lead zirconium titanate and strontium bismuth titanate. Using such materials enables the creation of much smaller and simpler capacitor structures for a given stored charge requirement, enabling the packing density dictated by future circuit design.

Despite the advantages of high dielectric constants and low leakage, insulating inorganic metal oxide materials suffer from many drawbacks. For example, all of these materials incorporate oxygen or are otherwise exposed to oxygen for densification to produce the desired capacitor dielectric layer. Densification or other exposure to an oxygen containing environment is utilized to fill oxygen vacancies which develop in the material during its formation. For example when depositing barium strontium titanate, the material as-deposited can have missing oxygen atoms that may deform its crystalline structure and yield poor dielectric properties. To overcome this drawback, for example, the material is typically subjected to a high temperature anneal in the presence of an oxygen ambient. The anneal drives any carbon present out of the layer and advantageously injects additional oxygen into the layer such that the layer uniformly approaches a stoichiometry of five oxygen atoms for every two tantalum atoms. The oxygen anneal is commonly conducted at a temperature of from about 400° C. to about 1000° C. utilizing one or more of $O_3$, $N_2O$ and $O_2$. The oxygen containing gas is typically flowed through a reactor at a rate of from about 0.5 slm to about 10 slm.

Unfortunately, such high temperature processing can degrade other substances in the circuitry. Such degradation can reduce the reliability of various circuit devices and has been viewed as a significant obstacle to incorporating high dielectric constant materials into integrated circuits.

SUMMARY

The invention comprises capacitor processing methods, for example as found in logic and memory circuitry, and even more specifically to DRAM processing methods. In but one implementation, a capacitor processing method includes forming a capacitor comprising first and second electrodes having a capacitor dielectric region therebetween. The first electrode interfaces with the capacitor dielectric region at a first interface. The second electrode interfaces with the capacitor dielectric region at a second interface. The capacitor dielectric region has a plurality of oxygen vacancies therein. After forming the capacitor, an electric field is applied to the capacitor dielectric region to cause oxygen vacancies to migrate towards one of the first and second interfaces. Oxygen atoms are preferably provided at the one interface effective to fill at least a portion of the oxygen vacancies in the capacitor dielectric region. Preferably at least a portion of the oxygen vacancies in the high k capacitor dielectric region are filled from oxide material comprising the first or second electrode most proximate the one interface.

In one implementation, a method of reducing oxygen vacancies in a high k capacitor dielectric region comprises causing oxygen vacancies to migrate towards an interface between the capacitor dielectric region and one of a pair of opposing capacitor electrodes under conditions effective to cause oxygen atoms present at the interface to fill at least a portion of the vacancies after fabrication of the capacitor electrodes and capacitor dielectric region.

In one implementation, a DRAM processing method includes forming DRAM circuitry comprising DRAM array capacitors having a common cell electrode, respective storage node electrodes, and a high k capacitor dielectric region therebetween. A voltage is applied to at least one of the first and second electrodes to produce a voltage differential therebetween under conditions effective to cause oxygen vacancies in the high k capacitor dielectric region to migrate toward one of the cell electrode or the respective storage node electrodes and react with oxygen to fill at least a portion of the oxygen vacancies in the capacitor dielectric region.

Other implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
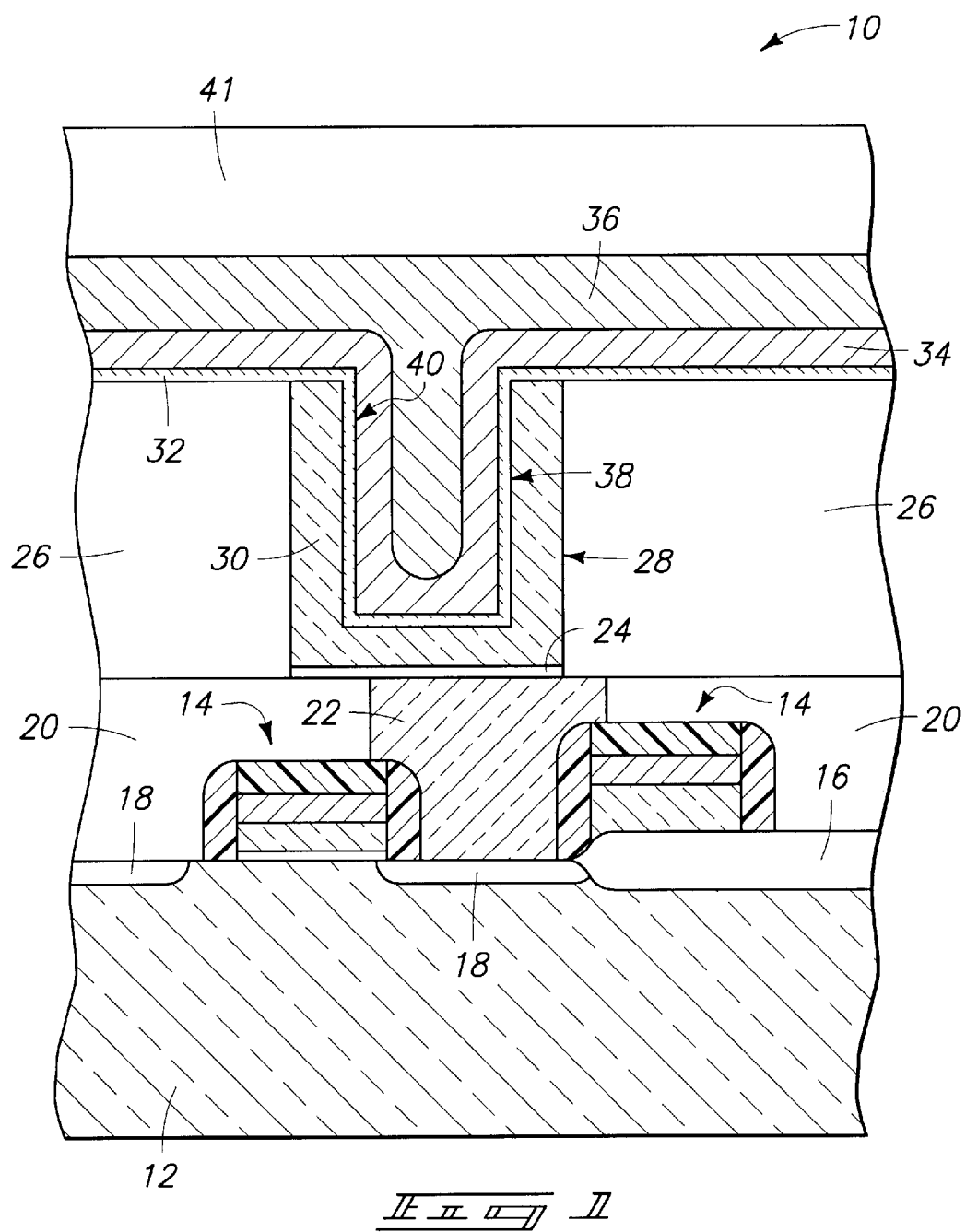
FIG. 1 is a diagrammatic sectional view of a portion of a semiconductor wafer fragment at a processing step in accordance with an aspect of the invention.

One exemplary method of processing a capacitor is described initially with reference to FIG. 1. There depicted is a semiconductor wafer fragment 10 comprising a bulk monocrystalline silicon semiconductor substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive materal layers (either alone or in assemblies comprising other materials). The term "substrate" refers to any supporting structure, including, but not limited to, the semiconductive substrates described above. A field oxide region 16 is formed relative to substrate 12, as are a plurality of transistor gate constructions 14 and adjacent transistor source/drain regions 18 within substrate 12. An insulating layer 20, for example borophosphosilicate glass (BPSG), is formed over gate constructions 14 and field oxide region 16. A conductive contact plug 22 extends through insulating layer 20 and electrically connects with a source drain region 18 between gate electrode constructions 14. An example material is conductive doped polysilicon deposited by chemical vapor deposition. A silicide contact interface or other material might also be received intermediate plug 22 and source/drain region 18 (not shown). Example alternate materials, and by way of example only, for plug 22 include tungsten and aluminum. Preferably, some electrically conductive barrier layer 24 is provided over conductive plug 22 to serve as a shield to oxidation where a subsequently formed capacitor storage node layer comprises a conductive oxide. Exemplary materials include tantalum nitride, tantalum silicon nitride, titanium nitride, titanium aluminum nitride, titanium silicon nitride, molybdenum or the like.

Another electrically insulating layer 26 is formed over insulating layer 20, with BPSG being one example preferred material. An opening 28 is formed within material 26 effective to expose conductive material of barrier layer 24 or conductive plug 22. Alternately, barrier layer 24 might be formed after formation of opening 28. A conductive first capacitor electrode layer 30 is thereafter deposited to less than completely fill opening 28. Such is preferably planarized back to isolate and form an isolated first capacitor electrode 30 within opening 28. First electrode 30 preferably comprises one or more layers of one or more conductive materials, with preferred materials being conductive metal oxides, such as ruthenium oxide, iridium oxide, and titanium oxygen nitride. Alternate materials include, by way of example only, conductively doped polysilicon, hemispherical grain polysilicon, platinum, ruthenium, iridium, palladium, tungsten, tungsten nitride, tantalum nitride, titanium nitride, and the like.

A capacitor dielectric layer 32 is formed over material 26 and first capacitor electrode 30. A conductive layer 34 is formed over dielectric layer 32. Further as shown in the illustrated example, another conductive layer 36 is formed above second conductive layer 34. Layers 34 and 36 in the illustrated example comprise a second capacitor electrode. Capacitor dielectric layer 32 thereby is received between first electrode 30 and second electrode 34/36 and constitutes a capacitor dielectric region therebetween. Layer 32 might constitute one or more layers or materials. Example materials include silicon dioxide or silicon nitride. In another and more preferred embodiment, capacitor dielectric region 32 comprises a high k capacitor dielectric which will typically have a plurality of oxygen vacancies received therein. Example materials include tantalum pentoxide, oxide paralectric materials, barium strontium titanate, strontium titanate, barium titanate, lead zirconium titanate, strontium bismuth titanate, or the like. In the context of this document, "high k" constitutes a material having a dielectric constant greater than or equal to 11. Such are preferably deposited by known chemical vapor deposition techniques. An example and preferred thickness for dielectric region 32 is from 40 Angstroms to 2000 Angstroms. For purposes of the continuing discussion, first electrode 30 interfaces with capacitor dielectric region 32 at a first interface 38. Second capacitor electrode 34/36 interfaces with capacitor dielectric region 32 at a second interface 40. A subsequently deposited or formed dielectric layer 41 is received over second capacitor electrode 34/36.

Example preferred materials for second capacitor electrode layer 34 include the same as those for first capacitor electrode 30. Preferred materials for conductive layer 36 preferably comprises polysilicon or tungsten.

In a preferred implementation, oxygen vacancies present in capacitor dielectric region 32 are caused to migrate towards one of first and second interfaces 38, 40, respectively. Further in accordance with the preferred implementation, effective conditions are provided to cause oxygen atoms present at the interface to fill at least a portion of the oxygen vacancies in capacitor dielectric region 32 and after fabrication of the respective capacitor electrodes and capacitor dielectric region. In a preferred implementation, migration is caused by imparting an electric field to capacitor dielectric region 32 effective to cause the oxygen vacancies to migrate towards one of the first and second interfaces. The electric field is preferably applied to be substantially uniform across capacitor dielectric region 34 between the first and second capacitor electrodes. Oxygen vacancies in capacitor dielectric region 32 are mobile under forces imparted by an electric field of sufficient strength and under certain temperature conditions. Depending upon the polarity of the applied electric field, oxygen vacancies can migrate toward one of electrodes 30 or 34/36.

A preferred manner of applying an electric field is to apply a voltage to at least one of first electrode 30 and second electrode 34/36 to produce a voltage differential therebetween. An example preferred voltage for application to second capacitor electrode 34/36 is 2.5 volts, while that applied to first capacitor electrode 30 is −1.0 volt. Such a positive bias on second electrode 34/36 will cause oxygen vacancies to migrate towards second interface 40. Reversing the voltages, and alternate voltages, could of course be utilized without departing from the principles of this aspect of the invention. By way of example only, voltage might be only applied to one of first electrode 30 and second electrode 34/36. Oxygen vacancy migration can further be facilitated by applying a suitable high temperature during application of the electric field. The elevated temperature is most preferably some temperature less than 400° C. to avoid the high temperature processing problems associated with the prior art, as described in the Background section above. Yet, elevated temperature is preferably at least 50° C., and more preferably at least 100° C. during application of the electric field. One example preferred process where dielectric region 32 consists essentially of a 200 Angstrom thick barium strontium titanate film with 51.0 atomic percent Ti includes an electric field of about 1500 kV/cm where the top electrode is provided at a bias voltage of 3.0 volts and the bottom electrode at −1.0 volts for about 2 minutes and at 200° C. to 225° C.

It is believed that the mere migration of oxygen vacancies from throughout a capacitor dielectric region to be positioned and more localized proximate one of the capacitor electrodes can itself reduce leakage current, increase capacitance and improve reliable operation. However further most preferably, oxygen atoms are preferably provided at the interface to which at least some of the oxygen vacancies have migrated and under conditions effective to fill at least a portion of those oxygen vacancies in capacitor dielectric region 32. Such conditions preferably include a temperature of at least 50° C., and again less than 400° C. to preclude the prior art high temperature processing problems described above. An example preferred temperature is at least 200° C. for about 2 minutes for the treatments indicated above (i.e., for barium strontium titanate). Where oxygen is provided at the one interface, the application of an electric field (for example as described above) in combination with the elevated temperature can result in oxygen vacancy filling at the interface substantially simultaneously with the migration.

Oxygen atoms available for filling oxygen vacancies might be provided at the interface by a number of different manners. In but one embodiment, the oxygen atoms might be provided by diffusion of oxygen through the first or second electrode most proximate the one interface to which the oxygen vacancies have migrated. For example with respect to the FIG. 1 embodiment, and before or after layer 41 is deposited, materials for layers 34 and 36 and conditions might be chosen during processing whereby oxygen atoms can diffuse through layers 34 and 36 to interface 40 for combination with oxygen vacancies which have there migrated. For example, one of layers 34 or 36 (or both) could be deposited in an oxidizing ambient, for example comprising $O_2$, $N_2O$ and/or $O_3$. A specific example CVD process for ruthenium oxide includes precursors of ruthenocene [$Ru(C_2H_5)_2$] and one or more oxygen containing gases, such as $O_2$, $O_3$ or $N_2O$. The ruthenocene is preferably maintained as a liquid at 90° C. with a carrier gas such as argon bubbled therethrough to a reactor at from 5 sccm to 10 sccm. Example oxygen gas flow is at 200 sccm. Example reactor temperature and pressure are 450° C. and 50 mTorr, respectively. An example CVD process for platinum includes precursors of trimethylcyclopentadienylplatinum and one or more oxygen containing gases, such as $O_2$, $O_3$ or $N_2O$. The trimethylcyclopentadienylplatinum is preferably maintained as a liquid at 30° C. with a carrier gas such as argon bubbled therethrough to a reactor at from 150 sccm. Example $N_2O$ gas flow is at 400 sccm. Example reactor temperature and pressure are 450° C. and 10 Torr, respectively. The oxygen atoms in such deposition will typically form little if any oxide with the platinum, and rather be suspended within the platinum layer.

Alternately by way of example only, deposition might occur in a non-oxidizing ambient and choosing an electrode material which is diffusive to oxygen (i.e., Pt), and subsequently conducting an oxidizing anneal. For example, platinum could be deposited by sputtering or CVD without oxygen atom incorporation. An example subsequent oxidizing anneal includes an oxygen containing gas environment (i.e., $O_2$, $O_3$, $N_2O$, and the like) at from 400° C. to 800° C., from 1 Torr to 760 Torr, and for from 10 seconds to 30 minutes.

Alternately, and by way of example only, various capacitor constructions might be provided to have edge-exposed capacitor dielectric regions. In such instances, oxygen atoms might be provided by lateral diffusion of oxygen from the edges along the subject interfaces for providing oxygen for vacancy filling. An example process for doing so is that described immediately above, and even where the outer electrode material is not necessarily comprised of a material readily diffusive to oxygen.

By way of further alternative, and in a most preferred example, at least the first or second electrode most proximate the one interface to which the oxygen vacancy has migrated preferably comprises oxygen atoms as formed. Thereby the oxygen atoms inherently present within the conductive electrode material can be provided to fill the oxygen vacancies in the dielectric. The most example preferred materials for achieving the same include the conductive metal oxides referred to above.

The above-described methods provide but exemplary preferred methods of reducing oxygen vacancies in a high k capacitor dielectric region by causing oxygen vacancies to migrate towards an interface between a capacitor dielectric region and one of a pair of opposing capacitor electrodes, and under conditions effective to cause oxygen atoms present at the interface to fill at least a portion of the vacancies after fabrication of the capacitor electrodes and capacitor dielectric region. Alternate methods are also of course contemplated.

U.S. patent application Ser. No. 09/326,429 entitled "Dielectric Cure for Reducing Oxygen Vacancies", filed on Jun. 4, 1999 and listing the inventors as Cem Basceri and Gurtej S. Sandhu is hereby incorporated by reference.

Figure 2:
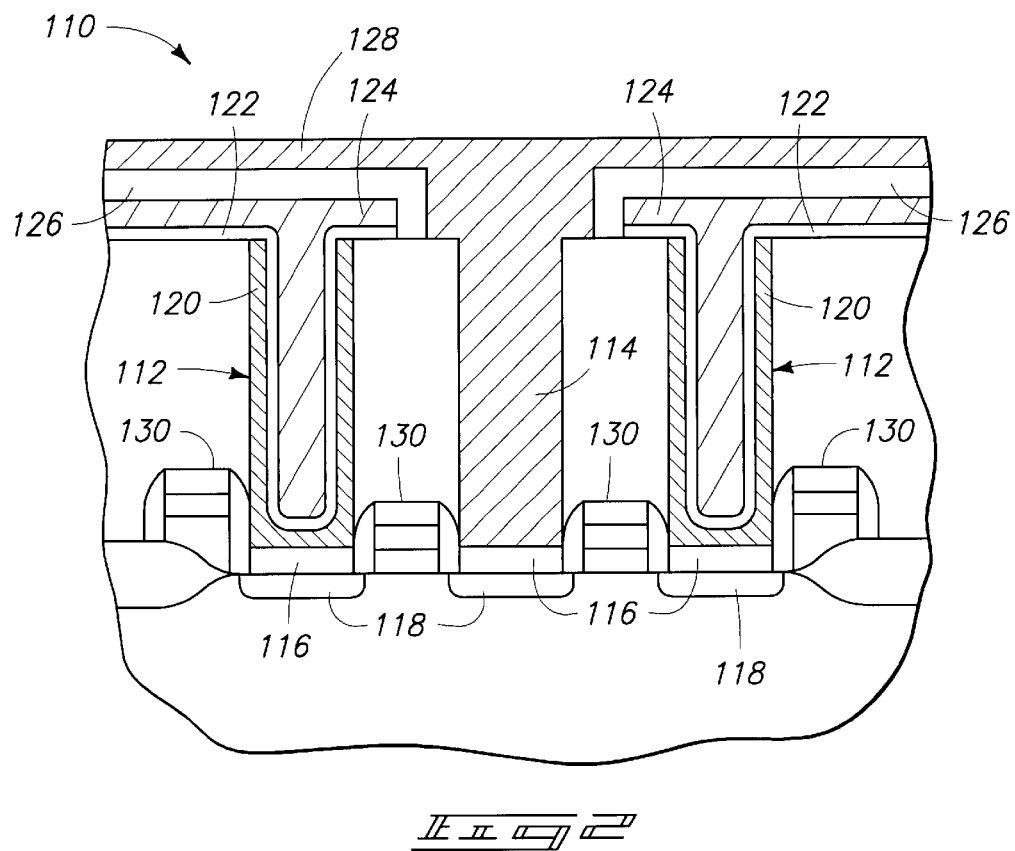
FIG. 2 is a diagrammatic sectional view of a portion of a semiconductor fragment comprising DRAM circuitry at a processing step in accordance with an aspect of the invention.

Further by way of example only, the above and other aspects of the invention are contemplated in connection with DRAM processing methods. Exemplary DRAM circuitry is described with reference to FIG. 2. A wafer fragment 110 comprises two memory cells, with each comprising a memory cell storage capacitor 112 and a shared bit contact 114. Capacitors 112 electrically connect with substrate diffusion regions 118 through polysilicon and/or silicide regions 116. Diffusion regions 118 constitute a pair of source/drain regions for individual field effect transistors. Individual storage capacitors 112 comprise a first capacitor electrode 120 in electrically connection with one of a pair of source/drain regions 118 of one field effect transistor, and a second capacitor electrode 124. Second capacitor electrode 124 preferably comprises a cell electrode common to all capacitors within the array. A capacitor dielectric region 122 is received intermediate first capacitor storage node electrodes 120 and second common cell electrode 124. Preferred material for electrodes 120 and 124, and for capacitor dielectric region 122, are those as described above.

An insulating layer 126 is formed over second capacitor electrode 124. A bit line 128 of an array of bit lines is fabricated in electrical connection with bit contact 114. An array of word lines 130 is fabricated to constitute gates of individual field effect transistors to enable selective gating of the capacitors relative to bit contact 114 in ultimate operation of the circuitry. The above describes but one exemplary process and structure in forming DRAM circuitry comprising DRAM array capacitors having a common cell electrode, respective storage node electrodes, and a high k capacitor dielectric region therebetween. Most preferably, at least one and preferably both of the common cell electrode and the respective storage node electrodes comprise one or more conductive metal oxides, as described above.

In accordance with one preferred aspect of the invention, a first voltage is applied to cell electrode 124 and a different second voltage is applied to storage node electrodes 120 under conditions effective to cause oxygen vacancies in capacitor dielectric region 122 to migrate toward one of cell electrode 124 or respective storage node electrodes 120, and to react with oxygen to fill at least a portion of the oxygen vacancies in capacitor dielectric region 122. Preferred conditions and methods are as described above relative to providing oxygen at interfaces between electrodes 124/120 with respect to capacitor dielectric region 122. Most preferably, one or both of cell electrode 124 or storage node electrodes 120 comprise a conductive metal oxide, with the oxygen for filling vacancies coming from such solid electrode material.

Figure 3:
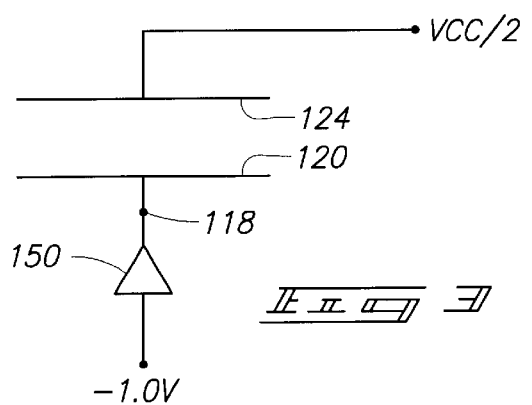
FIG. 3 is a schematic view of operation of a portion of the FIG. 2 circuitry in accordance with an aspect of the invention.

FIG. 3 schematically illustrates a preferred processing, whereby the first voltage and as applied to cell electrode 124 is $V_{cc}/2$, where $V_{cc}$ refers to the internal operating voltage of the DRAM circuitry. An example existing preferred voltage for $V_{cc}$ is 3.0 volts. The second voltage applied to storage node electrodes 20 preferably comprises −1.0 volt in such instance. Such can effectively result from a −1.0 volt being applied to source/drain diffusion regions 118 by holding/bringing the bias potential of the backside of a typical p-type substrate to −1.0 volt with a charge pump. A p-well to buried contact region 118 diode 150 is effectively created as shown. The example preferred biasing will cause oxygen vacancy migration towards cell electrode 124. The applied voltages could be reversed to cause oxygen vacancy migration towards storage node electrodes 120. Most preferably, the first and second applied voltages remain substantially constant for at least 15 seconds, and more preferably for at least one minute. Further most preferably, refresh circuitry of the DRAM circuitry (not shown) remains in an "off" condition during the method. Further most preferably, the array capacitors have no charge written into them during the processing. Processing in this manner where void of charge and void of recess operation will facilitate electric field stability and maintenance across capacitor dielectric region 122 during the above-described and preferred burn-in processing to achieve oxygen vacancy migration and filling. The invention also contemplates oxygen vacancy migration in capacitors in DRAM and other circuitry regardless of oxygen vacancy fill.

Further, the invention contemplates application of a first voltage greater than ground to a cell electrode and a second voltage less than ground to storage node electrodes of DRAM circuitry and at a temperature of at least 50° C. while refresh circuitry of the DRAM circuitry remains in an "off" condition regardless of high k dielectric materials or oxygen vacancy presence. Further, the invention contemplates application of a first voltage greater than ground to the cell electrode and a second voltage less than ground to the storage node electrodes and at a temperature of at least 50° C. while the array capacitors have no charge written into them regardless of high k capacitor dielectric material, oxygen vacancy presence, or operation of refresh circuitry of the DRAM circuitry.

The invention also contemplates application of a voltage to only one of cell electrode 124 or storage node electrodes 120, and not the other.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of reducing oxygen vacancies in a high k capacitor dielectric region comprising causing oxygen vacancies to migrate towards an interface between the capacitor dielectric region and one of a pair of opposing capacitor electrodes under conditions effective to cause oxygen atoms present at the interface to fill at least a portion of the vacancies after fabrication of the capacitor electrodes and capacitor dielectric region.

2. The method of claim 1 wherein the causing comprises a temperature above room temperature.

3. The method of claim 1 wherein the causing comprises a temperature of at least 50° C.

4. The method of claim 1 wherein the causing comprises a temperature of at least 100° C.

5. The method of claim 1 wherein the causing comprises a temperature of at less than 400° C.

6. The method of claim 1 wherein the causing comprises applying an electric field.

7. The method of claim 1 wherein the causing comprises a temperature of at least 50° C. and applying an electric field.

8. The method of claim 1 wherein the causing comprises applying a voltage to at least one of the pair of electrodes to produce a voltage differential therebetween.

9. The method of claim 1 wherein the oxygen atoms come from one of the capacitor electrodes.

10. The method of claim 1 wherein the oxygen atoms come from solid electrode material of one of the capacitor electrodes.

11. A DRAM processing method comprising:
  forming DRAM circuitry comprising DRAM array capacitors having a common cell electrode, respective storage node electrodes, and a high k capacitor dielectric region therebetween; and
  applying a first voltage to one of the cell electrode or the storage node electrodes under conditions effective to cause oxygen vacancies in the high k capacitor dielectric region to migrate toward one of the cell electrode or the respective storage node electrodes and react with oxygen to fill at least a portion of the oxygen vacancies in the capacitor dielectric region.

12. The method of claim 11 wherein the applied voltages cause the oxygen vacancies to migrate toward the cell electrode.

13. The method of claim 11 wherein the applied voltages cause the oxygen vacancies to migrate toward the storage node electrodes.

14. The method of claim 11 wherein the oxygen is provided by diffusion of oxygen through one of the cell electrode or the storage node electrodes.

15. The method of claim 11 wherein the oxygen is provided by lateral diffusion of oxygen along an interface between the high k dielectric layer and the one of the cell electrode or the storage node electrodes.

16. The method of claim 11 wherein the one of the cell electrode or the storage node electrodes comprises oxygen as formed, the oxygen which reacts being provided by oxygen atoms of the one of the cell electrode or the storage node electrodes.

17. The method of claim 11 wherein the one of the cell electrode or the storage node electrodes comprises a conductive metal oxide, the oxygen being provided by oxide of the one of the cell electrode or the storage node electrodes.

18. The method of claim 11 wherein the applying comprises a temperature of at least 50° C.

19. The method of claim 11 wherein the applying comprises a temperature of at least 100° C.

20. The method of claim 11 wherein the applying comprises a temperature of less than 400° C.

21. The method of claim 11 further comprising applying a different second voltage to the other of the cell electrode or the storage node electrodes, one of the first and second voltages comprises $V_{cc}/2$ and the other the first and second voltages comprises a negative voltage relative to ground voltage.

22. The method of claim 21 wherein the first voltage is applied to the cell electrode and comprises $V_{cc}/2$, and the second voltage is applied to the storage node electrodes and comprises a negative voltage relative to ground voltage.

23. The method of claim 11 wherein refresh circuitry of the DRAM circuitry remains in an "off" condition during the method.

24. A DRAM processing method comprising:

forming DRAM circuitry comprising DRAM array capacitors having a common cell electrode, respective storage node electrodes, and a high k capacitor dielectric region therebetween; and applying a first voltage to one of the cell electrode or the storage node electrodes under conditions effective to cause oxygen vacancies in the high k capacitor dielectric region to migrate toward one of the cell electrode or the respective storage node electrodes.

25. The method of claim 24 wherein the applying comprises a temperature of at least 50° C.

26. The method of claim 24 wherein the applying comprises a temperature of at least 100° C.

27. The method of claim 24 wherein the applying comprises a temperature of less than 400° C.

28. The method of claim 24 wherein refresh circuitry of the DRAM circuitry remains in an "off" condition during the method.

* * * * *

UNITED STATES PATENT AND TRADEMARK OFFICE
CERTIFICATE OF CORRECTION

PATENT NO. : 6,673,669 B2
DATED : January 6, 2004
INVENTOR(S) : Cem Basceri et al.

It is certified that error appears in the above-identified patent and that said Letters Patent is hereby corrected as shown below:

Column 1,
Line 7, replace "naming Gem Basceri and Gurtej S. Sandhu as" with
-- naming Cem Basceri and Gurtej S. Sandhu as --

Column 3,
Line 34, replace "conductive doped polysilicon deposited by chemical vapor" with
-- conductively doped polysilicon deposited by chemical vapor --

Column 6,
Line 48, replace "electrode 120 in electrically connection with one of a pair of" with
-- electrode 120 in electrical connection with one of a pair of --

Column 8,
Line 25, replace "a temperature of at less than 400º C." with
-- a temperature of less than 400º C. --

Signed and Sealed this

Seventeenth Day of August, 2004

JON W. DUDAS
*Acting Director of the United States Patent and Trademark Office*